United States Patent [19]

Kushner

[11] 4,214,176

[45] Jul. 22, 1980

[54] STABILIZED CURRENT SOURCES NETWORK

[76] Inventor: Jury K. Kushner, ulitsa Khersonskaya, 25, Kv. 62, Moscow, U.S.S.R.

[21] Appl. No.: 944,984

[22] Filed: Sep. 22, 1978

[51] Int. Cl.$^2$ .................................... H03J 1/12

[52] U.S. Cl. .................................... 307/297; 307/299 B; 307/310; 323/4

[58] Field of Search .................... 307/296, 297, 299 B, 307/310; 357/92; 323/4, 19

[56] References Cited

U.S. PATENT DOCUMENTS

| | | | |
|---|---|---|---|
| 3,703,651 | 11/1972 | Blowers | 307/297 |
| 4,064,448 | 12/1977 | Eatock | 307/297 |

*Primary Examiner*—Stanley D. Miller, Jr.
*Assistant Examiner*—B. P. Davis
*Attorney, Agent, or Firm*—Holman & Stern

[57] ABSTRACT

A stabilized current sources network comprises nmultiple collector transistors each having m collectors connected to respective electronic elements, one of m collectors of any one of the transistors being coupled to a load resistor. The latter is coupled to a first common bus. There is a stabilization unit comprising a reference voltage source, an amplifier, and a comparison unit. The comparison unit has its first input coupled to the output of the reference voltage source, and has its second input coupled to the load resistor. The output of the comparison unit is coupled to the input of the amplifier whose output is coupled to the bases of the n multiple collector transistors having their emitters connected to a second common bus. The network makes it possible to decrease the number of components and insulated regions in LSI circuits and to enhance the stability of the associated current sources.

2 Claims, 2 Drawing Figures

STABILIZED CURRENT SOURCES NETWORK

FIELD OF THE INVENTION

The invention relates to communication electronics, and more particularly to a stabilized current sources network.

The invention is suitable, in the form of stabilized current sources, for use with integrated circuits employed in computer, measurement, radar and pulsed-technique industries.

DESCRIPTION OF THE PRIOR ART

Known in the art is a stabilized current sources network incorporating a resistor and a voltage source (cf. Skokon Z. E., Emitter Function Logic-logic Family for LSI, IEEE, 1973, VSC-8, No. 5, pp. 356–361). In this network there is a small number of components, for example, a resistor per a single current source; however, the current considerably depends on the voltage variation in the voltage source. Moreover, an increased internal resistance of the network requires a high supply voltage to attain a condition in which the current does not vary with different voltage signal levels. This results in a large amount of power consumed by the sources, while a resistor of a large rating requires a large area in the integrated circuit.

Stabilized current sources networks are widely used which employ transistors as current sources. In these networks the current stabilization is effected by a stabilization unit.

Known in the art is a stabilized current sources network (cf. "Microelectronics and Semiconductor Devices" No. 2, "Soviet Radio" Publishers, 1977, Moscow, pp. 65–79) incorporating a small number of components, for example, a transistor per a single current source. This network features, however, a low degree of stabilization of the current which markedly depends on the variation of supply voltage and temperature and on the spread of the input current-voltage characteristics of the transistors.

Known in the art is a stabilized current sources network (cf. the Great Britain Pat. No. 1,410,021, Int.Cl.H03F 1/00). This network comprises a small number of components; for example, a multiple collector transistor is operated as two to four current sources. This network features, however, poor stability of the current sources whose currents depend, to a greater extent, on the spread of the gain $\beta_1$ of the transistors and on the variation of the voltage of power supplies and temperature as well.

Known in the art is a stabilized current sources network (cf. "Microelectronics" No. 5, "Soviet Radio" Publishers, 1973, Moscow, pp. 273–281). The network comprises transistor-resistor current sources and a stabilization unit having its output coupled to the bases of the transistors of the current sources, while the emitters of the transistors are coupled to a common bus via a resistor. The transistor collectors serve as current source outputs.

In the described network, the current depends, to a lower extent, on the parameters of the transistors and the larger values of the resistor tend to lower the degree of the dependence. However, the network comprises a large amount of components, namely, a resistor and a transistor per a single current source. Moreover, each current source is installed in a separate insulated holder. Finally, the current sources have poor stability when effected by the variation of temperature and supply voltage.

SUMMARY OF THE INVENTION

An object of the invention is to provide a stabilized current sources network having a decreased number of components and insulated regions in integrated circuits with the result that the latter can be given a higher degree of integration.

Another object of the invention is to provide a stabilized current sources network providing for a greater stability of its current sources.

There is disclosed a stabilized current sources network comprising transistors having their bases coupled to a stabilization unit, and having their collectors coupled to electronic elements, said transistors being implemented, according to the invention, in the form of n multiple collector transistors each having m collectors, one of said m collectors of any one of said n multiple collector transistors being coupled to a first lead of a load resistor having its second lead coupled to a first common bus and the input of the stabilization unit, performing the functions of comparison of voltage of load resistor with the reference voltage and of amplifying the difference signal between said voltages, is coupled to the first output of the load resistor, and the output of the stabilization unit is coupled to bases of multiple collector transistors, whose emitters are coupled to a common bus.

It is expedient that the stabilization unit performing the functions of comparison the voltage of the load resistor with the reference voltage and of amplifying the difference signal between said voltages included a reference voltage source, an amplifier and a comparison unit, one of the inputs of which comparison unit being coupled to the output of the reference voltage source, and the other input of said comparison unit is an input of the stabilization unit, the output of the comparison unit being coupled to the input of the amplifier, and the output of the amplifier is an output of the stabilization unit.

The invention therefore makes it possible to realize LSI circuits having a large degree of integration, which provides, for example, for a greater performance of computers.

DESCRIPTION OF THE DRAWINGS

The invention will now be described, by way of example, with reference to the accompanying drawings, in which.

DESCRIPTION OF THE INVENTION

Figure 1:
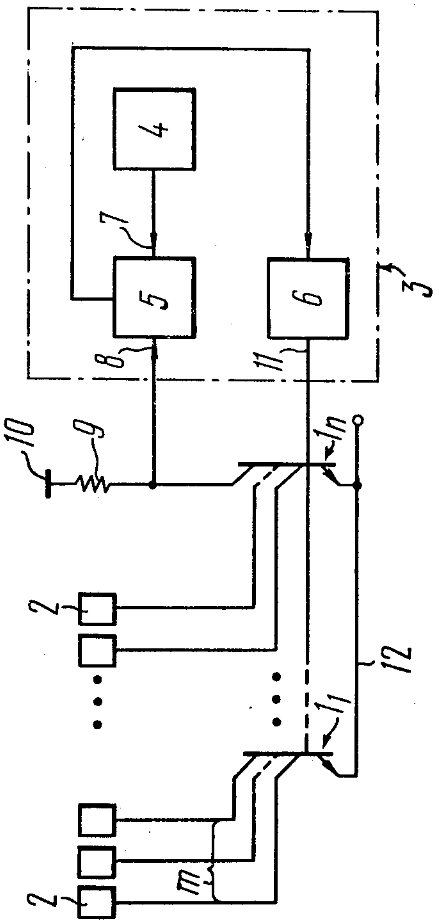
FIG. 1 is a block diagram of a stabilized current sources network, according to the invention.

The stabilized current sources network of the invention comprises current sources built around n multiple collector transistors $\mathbf{1}_1 \ldots \mathbf{1}_n$ (FIG. 1) each having m collectors coupled to electronic elements 2, and a stabilization unit 3. The latter incorporates a reference voltage source 4, a comparison unit 5, and an amplifier 6. An input 7 of the comparison unit 5 is coupled to the output of the reference voltage source 4, while an input 8 of the comparison unit 5 is coupled to a first lead of a load resistor 9. Connected to the first lead of the load resistor 9 is one of the m collectors of any one of the n multiple collector transistors $1_1 \ldots 1_n$. A second lead of the load resistor 9 is coupled to a common bus 10. The output of the comparison unit 5 is coupled to the input of the amplifier 6. An output 11 of the amplifier 6 is connected to the bases of the n multiple collector transistors $1_1 \ldots 1_n$ having their emitters coupled to a common bus 12.

Figure 2:
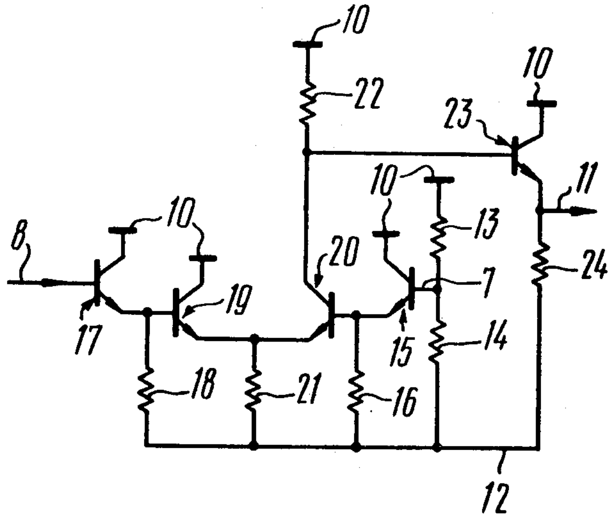
FIG. 2 is a circuit diagram of the stabilization unit, according to the invention.

FIG. 2 illustrates a circuit diagram of the stabilization unit 3, incorporating resistors 13,14; stages for biasing the input voltage level, built around emitter followers, the first one of the latter employing a transistor 15 and a resistor 16, and the second employing a transistor 17 and a resistor 18; a differential amplifier designed to compare voltages applied to it and perform voltage amplification and built around transistors 19,20 and resistors 21,22; and a current amplifier which is a third emitter follower employing a transistor 23 and a resistor 24. The resistors 13,14 are connected in series, while the resistor 13 is coupled to the common bus 10 and the resistor 14 is coupled to the common bus 12. The connection point of the resistors 13,14 is connected to the base of the transistor 15 having its collector coupled to the common bus 10, and having its emitter coupled to the base of the transistor 20 and, via the resistor 16, to the common bus 12. The emitter of the transistor 20 is coupled to the emitter of the transistor 19 and, via the resistor 21, to the common bus 12. The collector of the transistor 20 is coupled to the base of the transistor 23 and, via the resistor 22, to the common bus 10.

The collector of the transistor 19 is coupled to the common bus 10, while the base of the transistor 19 is coupled to the emitter of the transistor 17 and, via the resistor 18, to the common bus 12. The transistor 17 has its collector coupled to the common bus 10, and has its base coupled to one of the m collectors of any one of the n multiple collector transistors $1_1 \ldots 1_n$ (FIG. 1) and, via the load resistor 9, to the common bus 10. The transistor 23 (FIG. 2) has its collector coupled to the common bus 10, and has its emitter coupled to the bases of the n multiple collector transistors $1_1 \ldots 1_n$ (FIG. 1) and, via the resistor 24 (FIG. 2) to the common bus 12.

The reference voltage source 4 (FIG. 1) is built around the resistors 13,14. The comparison unit 5 (FIG. 1) is built around the transistors 15 (FIG. 2), 17, 19, 20 and the resistors 16, 18, 21, 22. The amplifier 6 is built around the transistors 19 (FIG.2), 20, 23 and the resistors 21, 22, 24.

The network of the invention operates in the following manner. The currents through the stabilized current sources are determined by the voltage produced by the reference voltage source 4 (FIG. 1). This voltage is applied to the input 7 of the comparison unit 5. Applied to the input 8 of the comparison unit 5 is the voltage across the load resistor 9. Since the current gain $\beta_1$ of the n multiple collector transistors $1_1 \ldots 1_n$, the temperature and the power supply, tend to vary, the voltage across the load resistor 9 is subject to a variation (the latter voltage becomes less or more than the voltage available from the reference voltage source 4) and an error signal appears at the output of the comparison unit 5 which is amplified in the amplifier 6 and is passed to the bases of the n multiple collector transistors $1_1 \ldots 1_n$ with the result that the voltage across the load resistor 9 is increased or decreased. The appearance of the voltage proportional to the current through the load resistor 9 and equal to the voltage of the reference voltage source 4 causes the error signal at the output of the comparison unit 5 to assume zero. In this case, the current through the current source employing the multiple collector transistor $1_n$ assumes a value proportional to the voltage produced by the reference voltage source 4. On the other hand, the currents through the current sources employing n−1 multiple collector transistors $1_1 \ldots 1_{n-1}$ assume their values proportional to the current through the load resistor 9 due to the fact that the parameters of these transistors, as belonging to integrated circuits, are identical.

The employment of the multiple collector transistors makes it possible to replace four current sources comprised of eight components and occupying four insulated regions in the integrated circuits with a single multiple collector transistors which requires no insulated region. This therefore provides for a greater degree of integration of LSI circuits.

The temperature variation as well as the identical variations of the parameters of the transistors 15 (FIG. 2), 17, 19, 20, 23 and the n multiple collector transistors $1_1 \ldots 1_n$ (FIG. 1), at a large gain K of the amplifier 6 and at a small output impedance of the latter, do not practically cause a change in the currents through the stabilized current sources since these variations are decreased in value by a factor of K due to the operation of the amplifier 6. Thus, the network of the invention provides for a greater degree of integration of the LSI circuits and improves the stability of the current sources.

Given below is a detailed description of the operation of the stabilization unit 3 (FIG. 2). The voltage across the connection point of the resistors 13,14 is applied to the input of the first emitter follower built around the transistor 15 and the resistor 16. This voltage does not practically depend on the temperature variation. The output of the first emitter follower produces a voltage applied to the first input of the differential amplifier built around the transistors 19,20 and the resistors 21,22. The voltage across the load resistor 9 (FIG. 1) is applied to the input of the second emitter follower built around the transistor 17 (FIG. 2) and the resistor 18. The voltage obtainable from the output of the second emitter follower is applied to the second input of the differential amplifier. The emitter followers connected to the inputs of the differential amplifier make it possible to increase its voltage gain and to extend the linear portion of its transfer characteristic so that this linear portion does not lie in the saturation region for a wide range of variation of destabilizing factors. The differential amplifier operates to compare the voltages applied to it and to perform voltage amplification.

The resistors 21,22 help select the operating mode and the gain of the differential amplifier. The output voltage of the latter is applied to the input of the third emitter follower built around the transistor 23 and the resistor 24. The output of the third emitter follower produces a voltage applied to the bases of the n multiple collector transistors $1_1 \ldots 1_n$ (FIG. 1). The third emitter follower is responsible for a small output impedance of the differential amplifier. As a result, a variation in the gains of the n multiple collector transistors $1_1 \ldots 1_n$ does not give a considerable influence on a variation of the currents through the stabilized current sources employing these transistors.

The stabilization unit 3 has a large gain, a small output impedance and a high loading capacity. The output of the stabilization unit 3 can be connected to ten multiple collector transistors $1_1 \ldots 1_n$ as a maximum, which corresponds to 40 current sources. With the stabilization unit 3, the current sources can be stabilized as the transistor parameters and the temperature tend to vary on a wide basis.

The invention therefore provides for a smaller number of components and insulated regions of LSI circuits and for greater stability of the associated current sources.

What is claimed is:

1. A stabilized current sources network for feeding electronic elements comprising:

n multiple collector transistors each having m collectors;

a load resistor; a first lead and a second lead of said load resistor;

a stabilization unit means for comparing any voltage on said load resistor with a reference voltage and for amplifying the difference signal between said voltages, said stabilizing unit means having an input and an output;

a first common bus;

a second common bus;

said m collectors of each of said multiple collector transistors, coupled to said electronic elements;

said emitters of said multiple collector transistors, coupled to said second common bus;

one of said m collectors of any one of said n multiple collector transistors, coupled to one of said leads of said load resistor;

said second lead of said load resistor coupled to said first common bus;

said input of said stabilization unit means coupled to said first lead of said load resistor;

said output of said stabilization unit means coupled to bases of said n multiple collector transistors.

2. A stabilized current sources network for feeding electronic elements as claimed in claim 1, wherein:

said stabilization unit means comprises:

a reference voltage source, a comparison unit, performing the function of comparison of voltages, and an amplifier of a difference voltage; an output of said reference voltage source; and input and output of said amplifier; a first and a second input and an output of said comparison unit;

said first input of said comparison unit, coupled to said output of said reference voltage source;

said second input of said comparison unit which is said input of said stabilization unit;

said output of said comparison unit, coupled to said input of said amplifier; and said output of said amplifier corresponding to said output of said stabilization unit.

* * * * *